(12) United States Patent
Straka et al.

(10) Patent No.: US 8,979,588 B2
(45) Date of Patent: *Mar. 17, 2015

(54) METHOD AND SYSTEM FOR IMPROVING CROSSTALK ATTENUATION WITHIN A PLUG/JACK CONNECTION AND BETWEEN NEARBY PLUG/JACK COMBINATIONS

(71) Applicant: Panduit Corp., Tinley Park, IL (US)

(72) Inventors: Frank M. Straka, Chicago, IL (US); Ronald L. Tellas, Schereville, IL (US); Jason J. German, Frankfort, IL (US); Vytas J. Vaitkus, Orland Park, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/157,748

(22) Filed: Jan. 17, 2014

(65) Prior Publication Data

US 2014/0154919 A1    Jun. 5, 2014

Related U.S. Application Data

(63) Continuation of application No. 13/432,969, filed on Mar. 28, 2012, now Pat. No. 8,632,362, which is a continuation of application No. 12/628,732, filed on Dec. 1, 2009, now Pat. No. 8,167,661.

(60) Provisional application No. 61/119,231, filed on Dec. 2, 2008.

(51) Int. Cl.
*H01R 13/648* (2006.01)
*H01R 13/658* (2011.01)
(Continued)

(52) U.S. Cl.
CPC ............ *H01R 13/658* (2013.01); *H01R 13/516* (2013.01); *H01R 24/64* (2013.01); *H01R 13/6466* (2013.01); *H01R 13/518* (2013.01); *Y10S 439/941* (2013.01);
(Continued)

(58) Field of Classification Search
CPC .................................................... H01R 13/658
USPC ............ 439/607.54, 607, 55, 607.35, 607.38, 439/607.4
See application file for complete search history.

(56) References Cited

U.S. PATENT DOCUMENTS 4,718,867 A    1/1988    Seidel et al.
5,030,114 A    7/1991    Carey et al.
(Continued)

FOREIGN PATENT DOCUMENTS

EP    1041683 A1    10/2000
EP    1592097 A2    11/2005

OTHER PUBLICATIONS

Explanation of attached drawing for applicant's Information Disclosure Statement and drawing of a foil shield that was used in communication jacks sold by Panduit at least as early as Nov. 2006 (2 pages).

*Primary Examiner* — Neil Abrams
(74) *Attorney, Agent, or Firm* — Christopher S. Clancy; Christopher K. Marlow

(57) ABSTRACT

An RJ45 communication jack has a housing with a top, bottom, front, and back. A foil is immediately adhered to and partially covers the housing. A top or bottom of the housing is covered by a first portion and a second portion of the foil wherein the first portion and the second portion are separated by a nonconductive gap. The gap extends from the front of the housing to the rear of the housing.

4 Claims, 7 Drawing Sheets

(51) Int. Cl.
*H01R 13/516* (2006.01)
*H01R 24/64* (2011.01)
*H01R 13/6466* (2011.01)
*H01R 13/518* (2006.01)
*H01R 13/6473* (2011.01)
*H05K 1/02* (2006.01)

(52) U.S. Cl.
CPC .......... *H01R 13/6473* (2013.01); *H05K 1/0228* (2013.01); *H05K 1/0239* (2013.01); *H05K 2201/10189* (2013.01)
USPC ..................................... 439/607.38; 439/941

(56) References Cited

U.S. PATENT DOCUMENTS

| | | | |
|---|---|---|---|
| 5,044,980 A | | 9/1991 | Krumme et al. |
| 5,256,086 A | * | 10/1993 | Ponn .................... 439/607.4 |
| 5,259,770 A | | 11/1993 | Bates et al. |
| 5,277,625 A | * | 1/1994 | Iannella et al. .......... 439/620.11 |
| 5,736,910 A | | 4/1998 | Townsend et al. |
| 5,772,472 A | | 6/1998 | Beutler et al. |
| 6,023,200 A | | 2/2000 | Rhee |
| 6,551,139 B1 | | 4/2003 | Yu |
| 6,572,411 B1 | | 6/2003 | Aeschbacher et al. |
| 6,585,540 B2 | | 7/2003 | Gutierrez et al. |
| 6,726,492 B1 | | 4/2004 | Yu |
| 7,033,210 B1 | | 4/2006 | Laurer et al. |
| 7,083,472 B2 | | 8/2006 | Gordon et al. |
| 7,187,766 B2 | | 3/2007 | Hammond, Jr. |
| 7,273,396 B2 | | 9/2007 | Itano et al. |
| 7,278,879 B2 | | 10/2007 | Kim et al. |
| 7,288,001 B1 | | 10/2007 | Aekins |
| 7,361,063 B2 | * | 4/2008 | Mullin et al. ................. 439/676 |
| 7,510,438 B2 | | 3/2009 | Hammond et al. |
| 7,530,854 B2 | | 5/2009 | Aekins |
| 7,549,890 B2 | | 6/2009 | Hashim |
| 7,575,482 B1 | | 8/2009 | Pepe et al. |
| 7,771,230 B2 | | 8/2010 | Hammond et al. |
| 7,798,857 B2 | * | 9/2010 | Hammond et al. ...... 439/620.22 |
| 7,824,231 B2 | | 11/2010 | Marti et al. |
| 7,828,603 B1 | | 11/2010 | Ku et al. |
| 7,857,667 B1 | | 12/2010 | Wang |
| 7,896,692 B2 | | 3/2011 | Gibson et al. |
| 7,946,894 B2 | | 5/2011 | AbuGhazaleh et al. |
| 7,972,150 B1 | * | 7/2011 | Lin ............................... 439/88 |
| 7,976,349 B2 | * | 7/2011 | Heckmann .................... 439/676 |
| 7,997,926 B2 | * | 8/2011 | Hammond et al. ......... 439/540.1 |
| 8,113,884 B2 | | 2/2012 | Matsuzaki et al. |
| 8,133,077 B2 | | 3/2012 | Okamoto |
| 8,167,661 B2 | | 5/2012 | Straka et al. |
| 2005/0207561 A1 | | 9/2005 | Hammond, Jr. |
| 2006/0134995 A1 | | 6/2006 | Bolouri-Saransar et al. |
| 2006/0246784 A1 | | 11/2006 | Aekins et al. |
| 2010/0041274 A1 | | 2/2010 | Marti et al. |

* cited by examiner

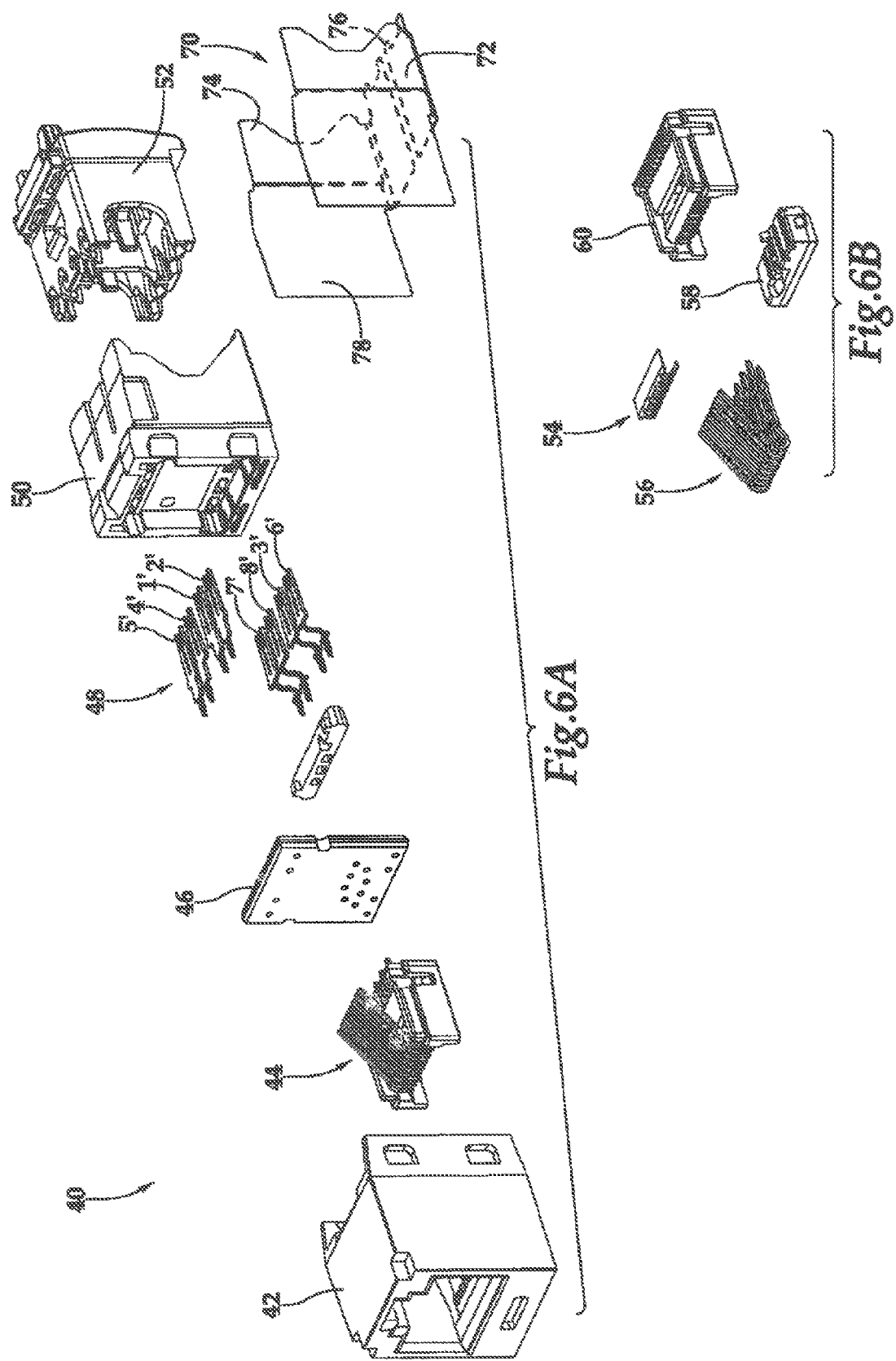

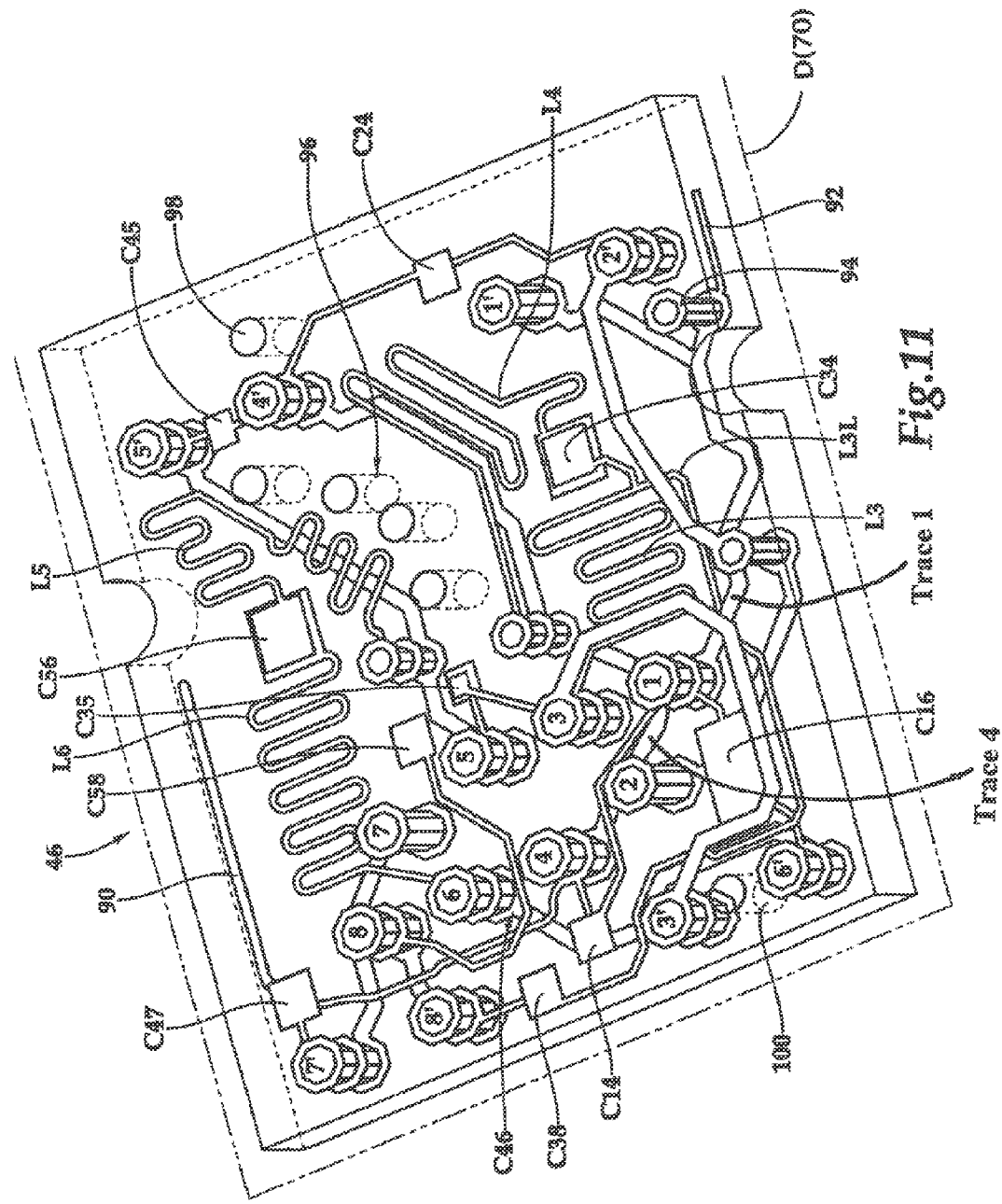

METHOD AND SYSTEM FOR IMPROVING CROSSTALK ATTENUATION WITHIN A PLUG/JACK CONNECTION AND BETWEEN NEARBY PLUG/JACK COMBINATIONS

CROSS REFERENCE TO RELATED APPLICATIONS

This application is a continuation of U.S. application Ser. No. 13/432,969, filed Mar. 28, 2012, now U.S. Pat. No. 8,632,362, which is a continuation of U.S. application Ser. No. 12/628,732, filed Dec. 1, 2009, now U.S. Pat. No. 8,167,661, issued May 1, 2012, which claims priority to U.S. Provisional Application Ser. No. 61/119,231, filed on Dec. 2, 2008, the entirety of which are hereby incorporated by reference.

BACKGROUND OF THE INVENTION

There is a continuing need to obtain more margin in communication channels for near-end and far-end crosstalk (NEXT and FEXT), and alien near-end and far-end crosstalk (ANEXT and AFEXT). A major source of NEXT and FEXT occurs within the plug of a plug/jack combination and is typically compensated for within the jack. A major source of alien crosstalk is common mode noise that couples between channels, particularly between adjacent jacks, and becomes converted into differential alien crosstalk (mode conversion).

BRIEF DESCRIPTION OF THE DRAWINGS

FIGS. 6A and 6B are exploded perspective views of an embodiment of a modular jack according to the present invention;

FIG. 11 is a see-through perspective view of the multi-layer rigid circuit board of the jack of FIGS. 6A and 6B;

Corresponding reference characters indicate corresponding parts throughout the several views. The examples set out herein illustrate some preferred embodiments of the invention, and such examples are not to be construed as limiting the scope of the invention in any manner.

DETAILED DESCRIPTION OF THE INVENTION

Figure 1A:
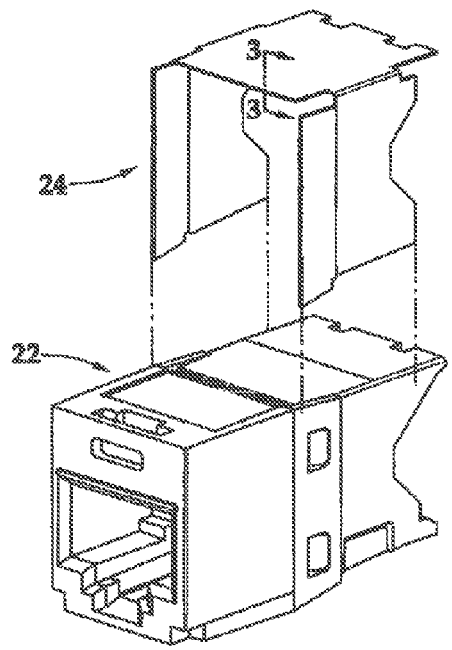
FIGS. 1A and 1B are perspective views of an embodiment of a jack with a foil shield according to the present invention.

Compensation methods and devices are described in a novel design for an improved category 6A (CAT6A) RJ45 jack design, to exceed TIA category 6A standards at 500 MHz, in U.S. Provisional Patent Application Ser. No. 61/090,403, entitled "High-Speed Connector with Multi-Stage Compensation," filed Aug. 20, 2008, which is incorporated by reference as if fully set forth herein. This jack addresses the need within the industry to obtain more margin for near end crosstalk (NEXT), far end crosstalk (FEXT), and return loss in order to meet the needs of demanding customers. Additionally, this jack reduces the differential to common and common to differential mode conversion (herein referred to as "mode conversion") that occurs within the jack to improve the alien crosstalk performance of the system.

U.S. Patent Application Publication No. 2006/0134995, also incorporated by reference as if fully set forth herein, discloses communications jacks which are provided with conductive covering layers to reduce the amount of ANEXT between connectors at insulation displacement contacts (IDCs) when the jacks are installed alongside one another. These conductive layers or foils are also part of the above cited U.S. Provisional Patent Application Ser. No. 61/090,403.

In other advances, the present invention addresses some of the current limitations in channel and permanent link performance respective to jack return loss margin at higher frequencies. In one embodiment of the present invention the jack transmission line components can include plug interface contacts (PICs) that mate with a plug and wrap around a sled and interface with a rigid circuit board, a flex circuit board that wraps around the sled with components in contact with the PICs, rigid circuit board circuit elements, and IDCs which also interface with the rigid circuit board and which allow for wires within cabling to connect with the IDCs. The plug/PICs, flex board, PIC region of the rigid board, and a compensation region of the rigid board can be considered a first impedance region; and the IDC vias region of the rigid board and IDCs can be considered a second impedance region following the first impedance region. If a jack connector has a relatively low impedance region (at the first impedance region) followed by a relatively high impedance region (at the second impedance region) there is more return loss margin at lower frequencies, but less return loss margin at higher frequencies. A jack with only the first low impedance region and not a relatively high impedance second region has less margin at lower frequencies, but more relative margin (as compared to a jack having a low impedance region followed by a relatively high impedance region) at higher frequencies. This same relationship applies when the magnitude values are opposite of that described, such as a jack with a high impedance region followed by a low impedance region, where an increase in the impedance of the low impedance region improves return loss.

Pair 4-5 is typically the pair with the worst return loss margin at higher frequencies in present day jack designs. Generally speaking, pair 4-5 has a low impedance region caused by the plug/PICs, flex board, PIC region of the rigid board, and compensation region of the rigid board, followed by a high impedance region caused by the respective IDCs and wire cap. A feature of the present invention is to reduce the impedance of the high impedance region so that the return loss gets relatively worse at lower frequencies, but the margin improves at high frequencies, which results in overall improved return loss margin relative to the CAT6A specification. Since the relationship between impedance and capacitance generally follows $Z=\sqrt{(L/C)}$, capacitance is added in the high impedance region to reduce the impedance of the high impedance region.

Figure 1B:
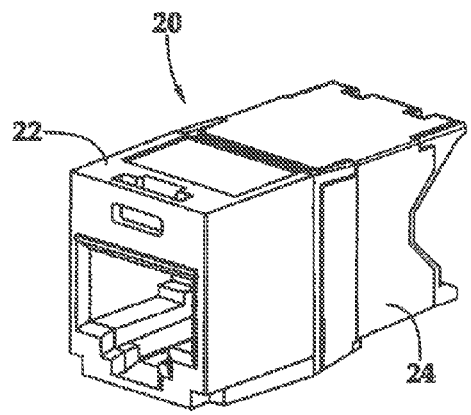
Figure 2A:
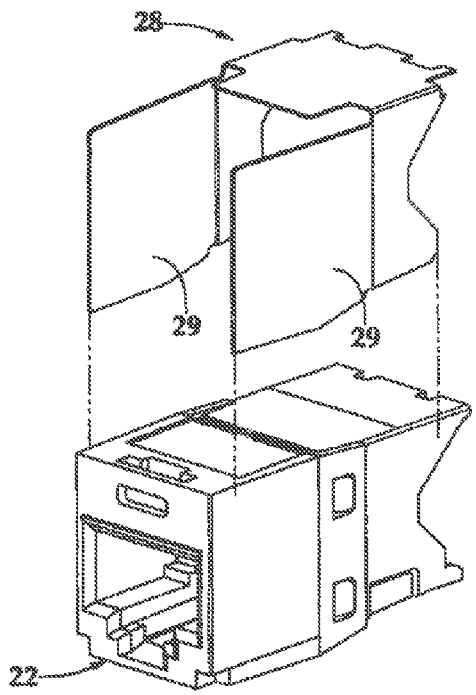
FIGS. 2A and 2B are perspective views of another embodiment of a jack with a foil shield according to the present invention.
Figure 2B:
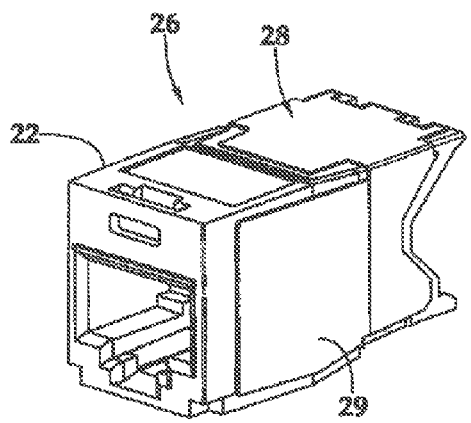
Figure 3:
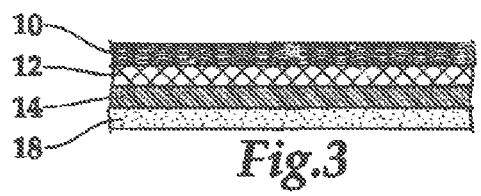
FIG. 3 is a cross-sectional view taken along section line 3-3 in FIGS. 1A and 1B, illustrating a stack-up for the adhesive foil material according to the present invention.

In a patch panel or outlet where there are many jacks clustered within an area, high levels of alien crosstalk can occur between these neighboring jacks. Previous understanding of this concept indicated that this coupling was primarily due to inductive differential coupling caused by the proximity of the neighboring wires and blades in adjacent plugs and jacks, and particularly parallel portions which run adjacent to each other. The foil label designs of FIGS. 1 and 2 address this problem. In FIG. 1, jack assembly 20 includes jack 22 and an adhesively mounted foil label or shield 24. Jack 22 can be a CAT6A jack design, for example. Alternatively, other jacks such as CAT6, CAT7, or others can be used. FIG. 2 illustrates jack assembly 26 which includes jack 22 and an adhesively mounted foil label 28 with extended sides 29. These foil labels 24, 28 are primarily used to reduce the amount of alien crosstalk occurring between neighboring jacks, as the level of coupling from non-neighboring jacks is already very low due to the fact that they are relatively far apart. Although not shown in FIGS. 1-2, jacks 20, 26 typically can include a wirecap as shown in FIG. 6 and other elements of FIG. 6. The foil labels include an adhesive material 18 with a metal liner 14, then a paint layer 12 and protective coating 10, which is shown in FIG. 3.

Figure 4:
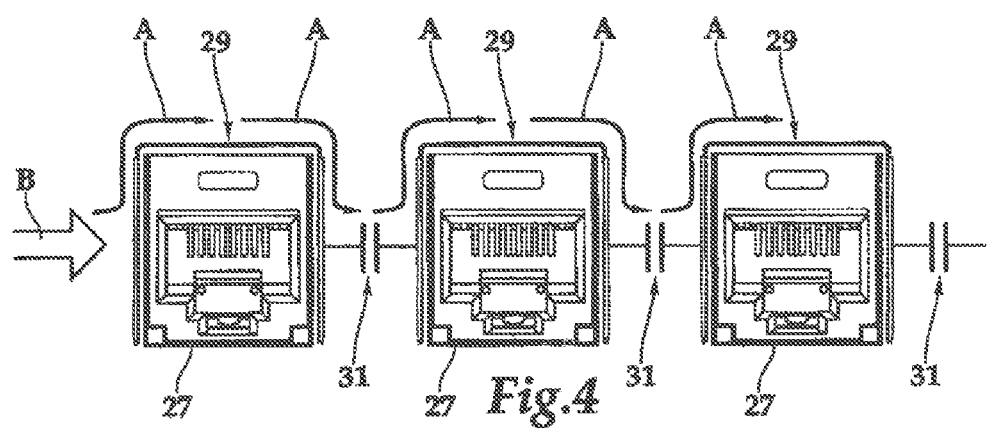
FIG. 4 is a schematic view illustrating alien crosstalk occurring due to common mode propagation along jack foil shields in nearby jacks which converts back into differential crosstalk in the jack.

However, it has been observed, that in a channel environment with a high level of common mode noise, that the foil shields provide an electrical connection (comprising a conductive path around the jack with capacitive coupling to adjacent jacks) for a common mode current to flow to and beyond neighboring jacks 27 as is shown by the arrows A in FIG. 4. This is a significant cause of alien crosstalk between non-neighboring jacks, as well as further increasing the amount of alien crosstalk between neighboring jacks. When several jacks, each of which include the foil shields according to FIGS. 1 and 2, are near each other, there exists a very low loss path for a common mode current to travel between jacks due the large amount of capacitive coupling between neighboring electrically conductive foils 29, and at least one embodiment of the present invention addresses this problem. In the example of FIG. 4, capacitive couplings 31 occur between neighboring foils 29 due to their close proximity and large overlapping surface areas. This allows for common mode transmission with low attenuation for frequencies approximately between 100 and 500 MHz. A common mode current, I, can be formed, as shown by the arrow B. In the illustration of FIG. 4, the spacing between the jacks 27 is enlarged for clarity, and the foils 29 are shown as separated from the jack housings for illustrative purposes. The common mode signal in the jacks becomes ANEXT and/or AFEXT.

In another aspect according to the present invention, it is desirable to have balanced capacitive and inductive loads between all differential pair combinations within the plug/jack combination in order to minimize mode conversion. It is also desirable to have each differential pair balanced with respect to the foil label design surrounding parts of the jack in order to further reduce mode conversion.

Herein described is a novel design for a jack with a foil label and an improved rigid circuit board that improves the balance of each differential pair on the jack with respect to the foil label, in addition to making improvements addressing the problems discussed above. The present invention reduces the mode conversion of the jack and improves alien crosstalk.

Figure 5:
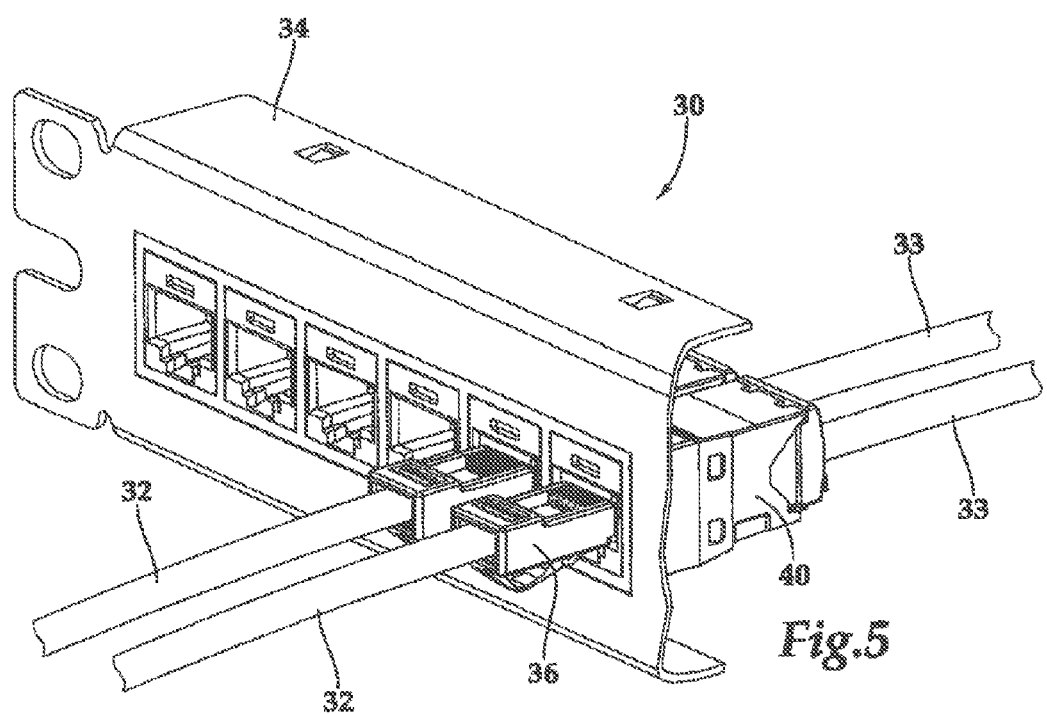
FIG. 5 is a fragmentary perspective of an embodiment of a communication system according to the present invention.

Referring now to the drawings, and more particularly to FIG. 5, there is shown a communication system 30, which can include communication cables, such as patch cables 32 and horizontal cables 33, connected to equipment 34. Equipment 34 is illustrated as a patch panel in FIG. 5, but the equipment can be passive equipment or active equipment. Examples of passive equipment can be, but are not limited to, modular patch panels, punch-down patch panels, coupler patch panels, wall jacks, etc. Examples of active equipment can be, but are not limited to, Ethernet switches, routers, servers, physical layer management systems, and power-over-Ethernet equipment as can be found in data centers/telecommunications rooms; security devices (cameras and other sensors, etc.) and door access equipment; and telephones, computers, fax machines, printers and other peripherals as can be found in workstation areas. Communication system 30 can further include cabinets, racks, cable management and overhead routing systems, and other such equipment.

Communication cables 32 and 33 are shown in the form of an unshielded twisted pair (UTP) cable, and more particularly a CAT6A cable which can operate at 10 Gb/s. However, the present invention can be applied to and/or implemented in connection with a variety of communications cables. Cables 33 can be terminated directly into equipment 34, or alternatively, can be terminated in a variety of punchdown or jack modules 40 such as R45 type, jack module cassettes, and many other connector types, or combinations thereof. Patch cables 32 are typically terminated in plugs 36.

Figures 7A, 7B:
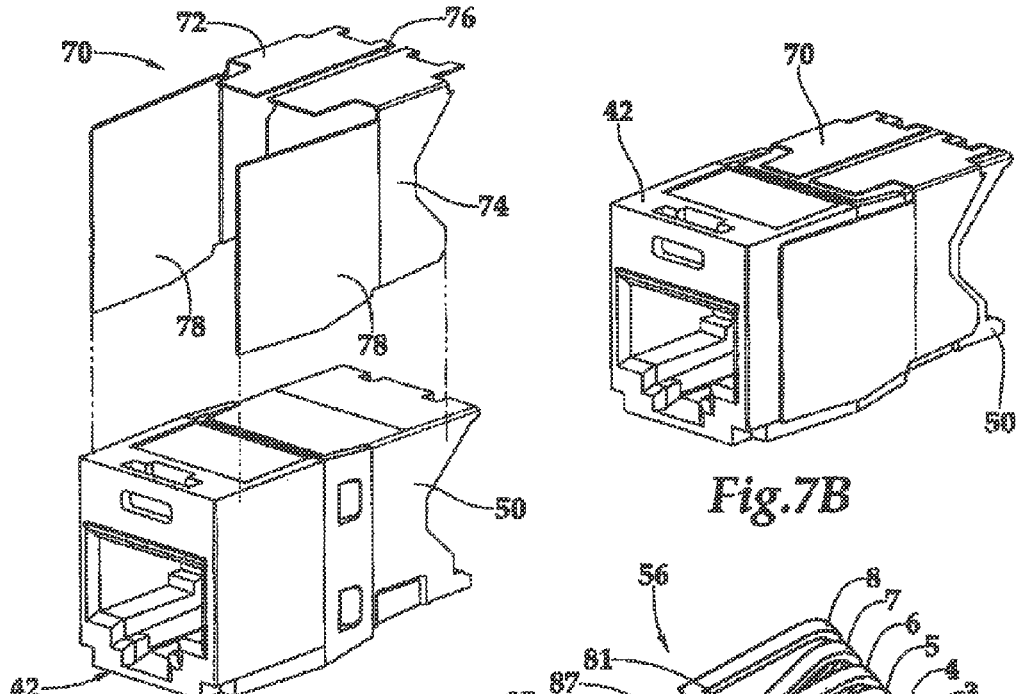
FIGS. 7A and 7B are perspective views of some aspects of the jack of FIGS. 6A and 6B.

FIG. 6 shows a more detailed exploded view of jack 40 which generally includes housing 42 that fits an RJ45 plug, a nose 44 that has eight PICs 56 that mate with a plug and wrap around sled 60, and interface with a rigid board 46. Rigid board 46 connects to IDCs 48, and rear sled 50 that holds the IDCs. A wire cap 52 allows for wires within cabling to connect with the IDCs, and this is also part of the jacks of FIGS. 1-2, although not shown in the views. Nose 44 includes a flex circuit board 54, plug interface contacts 56, front bottom sled 58 and front top sled 60. FIGS. 1 and 2 are different from FIG. 6 in that they respectively show the two foil label designs 24, 28, whereas FIG. 6 illustrates an improved foil label 70 (see also FIG. 7) having a first side 72 and a mirror image second side 74, with a gap 76 therebetween. The design of rigid board 46 described herein works with all three of these foils 24, 28 and 70. Like foil 28, foil label 70 includes extensions 78 that help reduce coupling between plugs and PICs in adjacent jacks.

Figure 8:
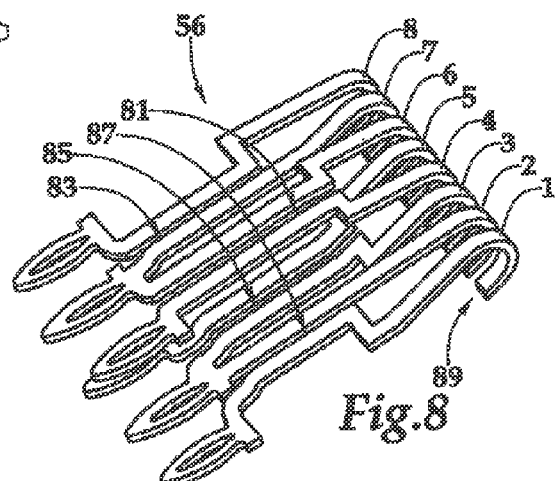
FIG. 8 is a perspective view of the plug interface contacts of the jack of FIGS. 6A and 6B.
Figure 9:
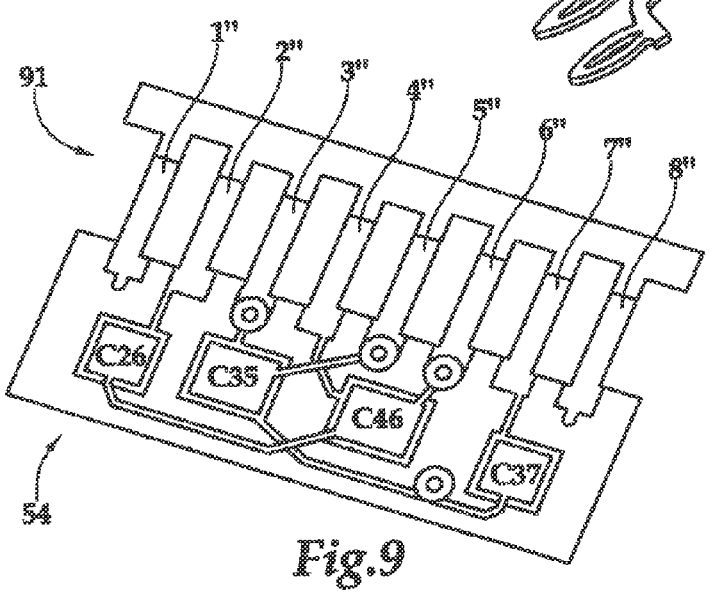
FIG. 9 is a see-through perspective view of the multi-layer flex circuit board of the jack of FIGS. 6A and 6B.
Figure 10:
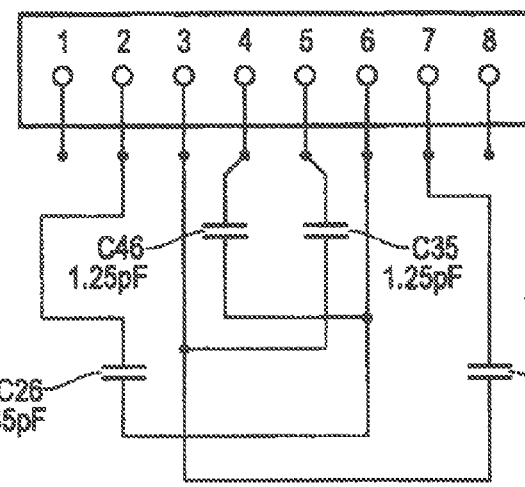
FIG. 10 is a schematic view of the flex circuit board of FIG. 9.
Figure 12:
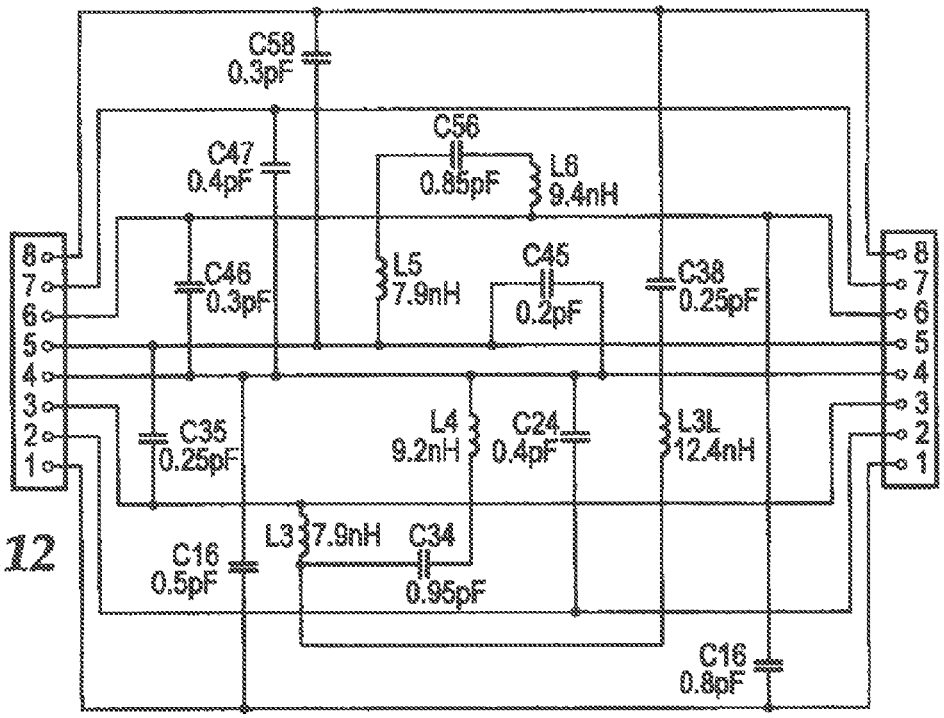
FIG. 12 is a schematic view of the rigid circuit board of FIG. 11.

Crosstalk compensation components can be included on both PICs 56 and flexible board 54, as shown in FIG. 8 and FIGS. 9-10, respectively. FIG. 8 shows the PICs 56 in order from the first through the eighth contacts. Areas shown in FIG. 8 include: (a) an area 81 that creates capacitive and inductive coupling between the conductors 4 and 6 in the nose (compensation between pair 4-5 and pair 3-6); (b) an area 83 that creates capacitive and inductive coupling between conductors 6 and 8 in the nose (compensation between pair 3-6 and pair 7-8); (c) an area 85 that creates capacitive coupling between conductors 3 and 5 in the nose (compensation between pair 4-5 and pair 3-6); and (d) an area 87 that creates capacitive and inductive coupling between conductors 1 and 3 in the nose (compensation between pair 3-6 and pair 1-2). An area 89 of the nose that interfaces with the plug is removed for clarity. In FIG. 9, the flex board 54 with its capacitors is shown. The portion of the flex board that makes contact with the PICs at the nose is shown at 91, and the contact areas 1"-8" make contact with plug interface contacts 1-8 as shown in FIG. 8. Referring particularly to FIGS. 11 and 12, rigid board 46 also includes crosstalk compensation components (either the same or opposite of polarity of plug crosstalk components), which are identified particularly in FIG. 12, with the exception of C45. C45 improves return loss margin at higher frequencies in pair 4-5 by reducing the relatively high impedance of the second impedance region, as previously discussed. Although the return loss gets relatively worse at lower frequencies as a result of this modification, the overall margin improves over the frequency band of interest. Rigid board 46 includes lattice type compensation as also discussed in U.S. Provisional Patent Application Ser. No. 61/090,403.

One of the novel aspects of the present invention is that it addresses a naturally unbalanced coupling which exists between all pairs and the foil label on the jack. The primary reason for this unbalance is shown in FIG. 6. The IDCs 48 that are near the edge of the jack (pins 5, 2, 6, 7) capacitively couple more strongly to the foil than the IDCs 48 (pins 4, 1, 3, 8) not near the edge of the jack. This is especially true on pair 4-5 and pair 1-2 where IDCs 5 and 2 are near the foil, and 1 and 4 are far away from it.

An embodiment of a rigid board solution for balancing the pairs with respect to the foil shield is shown in FIG. 11. FIG. 11 shows the location of foil covering 70 at D (labeled D(70) in the figure). In this embodiment rigid board 46 has four layers of conductive traces. The IDC vias receive and retain IDCs. The IDC vias are numbered 5'-4'-1'-2' at the top of the board in FIG. 11, and 7'-8'-3'-6' on the bottom edge of the board, and are also plated through holes which interconnect some of the traces on the various layers. Signals or noise can couple relatively strongly to foil label 70, particularly through the IDC vias and IDCs 5', 2', 6', and 7'. For pair 4-5, for example, IDC via 5' and IDC 5' are much closer to the foil label 70 than IDC via 4' and IDC 4' are. To balance this pair, conductive trace stub 90 is routed close to the edge of board 46 near the foil 70 and is electrically connected to trace 4 (a conductive trace interconnecting PIC via 4 with IDC via 4') by its connection to PIC via 4. Stub 90 thereby balances conductor 4 with respect to conductor 5 and the foil. Additionally and/or alternatively, trace 4 can be routed relatively close to the edge of rigid board 46 to increase the coupling to foil 70. In the embodiment shown stub 90 is 0.008 inches wide by 0.220 inches long in one half ounce copper (approximately 0.0007 inches thick), although other thicknesses, widths and lengths are possible. FIG. 11 shows at 1-8 the vias where the corresponding plug interface contacts are attached to the rigid board 48.

Similarly for pair 1-2, for example, IDC via 2' and IDC 2' are much closer to foil 70 than IDC via 1' and IDC 1' are. To balance this pair, conductive trace stub 92 is routed close to the edge of board 46 near the foil 70 and connected to trace 1 (conductive trace interconnecting PIC via 1 with IDC via 1') via plated through hole 94. Stub 92 is similar to stub 90; however, because of space limitations on rigid board 46, stub 92 is only 0.005 inches wide by 0.075 inches long, also in one ounce copper (approximately 0.0014 inches thick plus additional plating to achieve a thickness between 0.002-0.0035), although other thicknesses, widths and lengths are possible. To compensate for this relatively short length the pair 1-2 is further balanced by moving trace 1 very close to the board edge (closer to foil 70), and plated through hole 94 provides significant surface area in a third dimension (board thickness) which also capacitively couples to foil 70, giving stronger coupling between conductor 1 and the foil 70, thereby balancing the pair 1-2 with respect to foil 70. Unplated through holes generally at 96 reduce capacitance between traces 4 and 5 closer to the area of NEXT compensation to lessen the effects of compensation elements on return loss, by better impedance matching.

Figure 13:
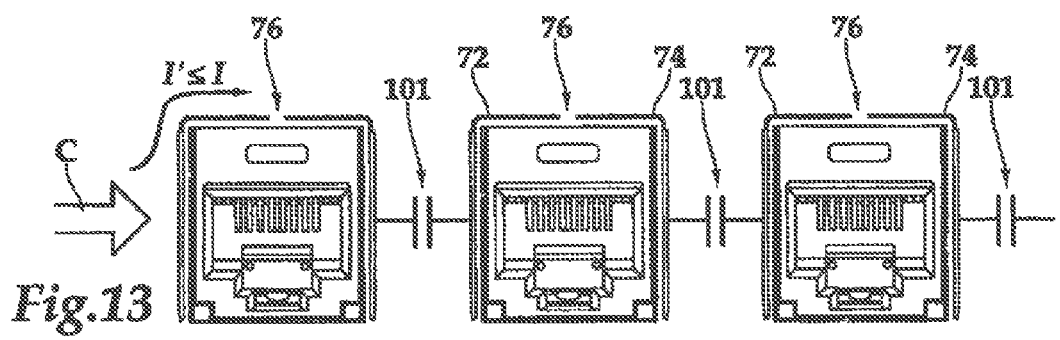
FIG. 13 is a schematic view illustrating how alien crosstalk is reduced according to the present invention by blocking common mode propagation along jack foil shields through the use of a split foil.
Figure 14:
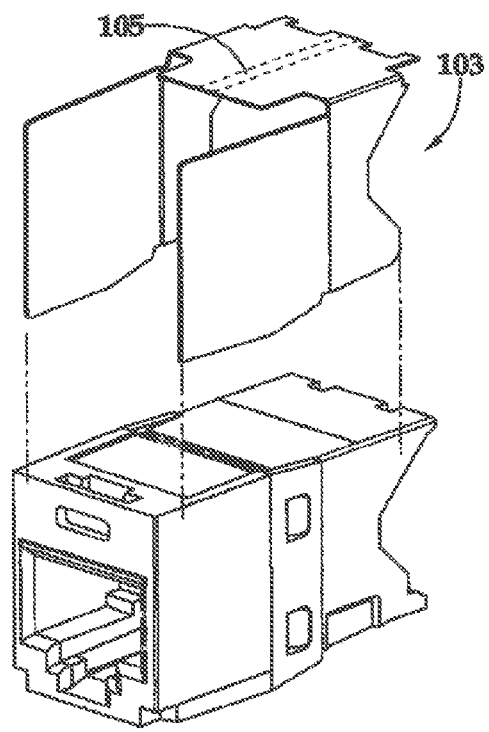
FIG. 14 is a perspective exploded view of another embodiment of a jack with a foil shield according to the present invention, where the foil shield is continuous but the metallization layer has a gap.

The result of the pair balancing with respect to the foil, and the use of a split foil is illustrated in FIG. 13. Capacitive couplings 101 between neighboring foils 72 and 74 are significantly attenuated by the gaps 76. The present invention achieves less common mode current I' in the direction of arrow C on the foil due to pair balancing relative to the foil, and the split foil eliminates the low-loss path for propagation of the common mode current from adjacent jack to adjacent jack. The overall improvement in alien crosstalk margin has been shown to be at least 4 dB with the improvements of the present invention. Further, the present invention can be used advantageously with each of the symmetric foil designs of FIGS. 1, 2, 6 and 14, although the designs of FIGS. 1 and 2 would not have the characteristics and advantages of the split shield. FIG. 14 includes a continuous single piece foil 103 with a gap 105 in the metallization.

In other aspects of the present invention, through hole 100 (shown in FIG. 11) is meant to have the opposite effect as C45, and through hole 98 can be eliminated as unnecessary. The addition of capacitor C24 and elimination of C15 improves NEXT on pair combination 45-12, relative to the invention of U.S. Provisional Patent Application Ser. No. 61/090,403. Some other comparisons to U.S. Provisional Patent Application Ser. No. 61/090,403 are as follows. Using inductive trace L3, along with the new inductor L3L, connects trace 3 to C38 and uses the lattice compensation and improves 36-78 NEXT. Changing the orientation of L6 to move it further away from the side of the rigid board reduces coupling to the foil. Moving the location of C58 and C16 better accommodates the new artwork of the present invention.

Figure 15:
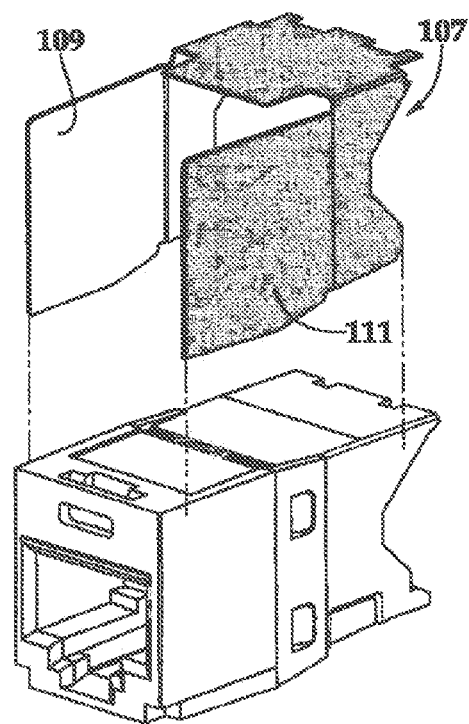
FIG. 15 is a perspective exploded view of another embodiment of a jack with a foil shield according to the present invention, where the foil shield is continuous but the metallization layer is present only on a base and one side.
Figure 16:
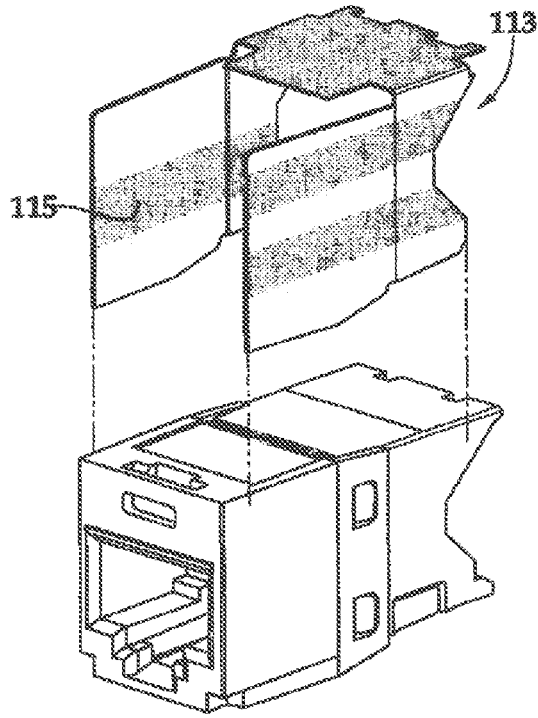
FIG. 16 is a perspective exploded view of another embodiment of a jack with a foil shield according to the present invention, where the foil shield is continuous but there are selected areas of the foil which have metallization layers.
Figure 17:
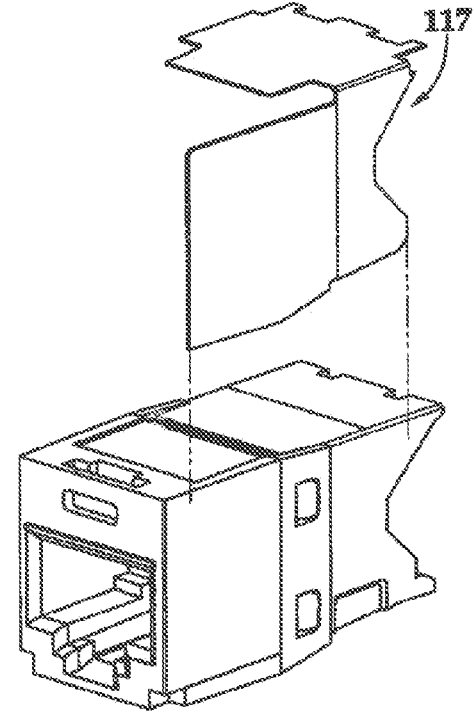
FIG. 17 is a perspective exploded view of another embodiment of a jack with a foil shield according to the present invention, where the foil shield is continuous with continuous metallization but the foil only includes a single side and top portions.

The asymmetric foil designs of FIGS. 15-17 typically require modifications to the balance circuitry shown in FIG. 11, such as smaller balance components on the side of rigid board 46 which have less, or no, conductive shielding. That is, smaller balance components are being provided on a particular portion of the rigid board that does not lie adjacent any conductive foil or shielding. Conceptually, each differential pair needs to achieve balance with each part of the foil so multiple foil parts require each foil part to be balanced with respect to the jack. FIG. 15 illustrates an embodiment of the foil label 107 where one side 109 does not have any metal (note that the embodiment shown here could be flipped so the opposite side is metalized). In the embodiment of the FIG. 15, the side 109 without metal may consist of adhesive, paint, and protective layers only, while the other side 111 is provided with a metal liner. FIG. 16 illustrates an embodiment of the foil label 113 with areas 115 selectively chosen for metallization; and FIG. 17 illustrates an embodiment of the foil label 117 which is an L-shaped metalized foil where one side of the jack and the top or base are covered by the foil leaving one side without any covering. Note that the embodiment shown in FIG. 17 can be modified by making the opposite side with a foil and the side shown in FIG. 17 removed.

Alternative embodiments of the present invention include a jack with the circuit board of FIG. 11, but with a capacitor C15 between IDC vias 1 and 5, or a jack with the circuit board of FIG. 11, but with capacitor C24 completely removed from the board along with any traces connected to it. Another alternative embodiment of the present invention eliminates the flex board.

While this invention has been described as having a preferred design, the present invention can be further modified within the spirit and scope of this disclosure. This application is therefore intended to cover any variations, uses, or adaptations of the invention using its general principles.

We claim:

1. An RJ45 communications jack comprising:
   a housing having a top, bottom, front, and back; and
   a foil at least partially covering and immediately adhered to said housing,
   wherein at least one of said top and said bottom is partially covered by a first portion of said foil and a second portion of said foil, said first portion and said second portion being separated by a non-conductive gap wherein said gap extends longitudinally along said at least one of said to and said bottom from the front of the housing to the rear of the housing.

2. The jack of claim 1, wherein said first portion is symmetrical to said second portion.

3. The jack of claim 2, wherein said first portion and said second portion are each substantially rectangular.

4. The jack of claim 1, wherein said housing further has a first side and a second side, said first portion of said foil extending to cover at least a portion of said first side and said second portion of said foil extending to cover at least a portion of said second side.

* * * * *